(12) United States Patent
Camp, Jr. et al.

(10) Patent No.: US 6,295,442 B1
(45) Date of Patent: Sep. 25, 2001

(54) AMPLITUDE MODULATION TO PHASE MODULATION CANCELLATION METHOD IN AN RF AMPLIFIER

(75) Inventors: William O. Camp, Jr., Chapel Hill; Jeffrey A. Schlang, Raleigh; Charles Gore, Durham, all of NC (US); Jacob Mannerstrale, Eslöv (SE)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/207,167

(22) Filed: Dec. 7, 1998

(51) Int. Cl.[7] ........................................................ H03G 3/30
(52) U.S. Cl. ............................ 455/102; 455/108; 455/205
(58) Field of Search ......................................... 455/102, 108, 455/107, 110, 115, 141, 205

(56) References Cited

U.S. PATENT DOCUMENTS

| | | | |
|---|---|---|---|
| 4,462,001 | 7/1984 | Girard | 330/149 |
| 4,499,434 | * 2/1985 | Thompson | 331/17 |
| 4,985,688 | 1/1991 | Nagata | 332/123 |
| 5,093,637 | 3/1992 | Isota et al. | 332/103 |
| 5,101,506 | * 3/1992 | Walls | 455/115 |
| 5,105,445 | 4/1992 | Karam et al. | 375/60 |
| 5,123,031 | 6/1992 | Kuisma | 375/60 |
| 5,351,016 | 9/1994 | Dent | 332/103 |
| 5,499,392 | * 3/1996 | Grunwell | 455/260 |
| 5,598,436 | 1/1997 | Brajal et al. | 375/297 |
| 5,650,758 | 7/1997 | Xu et al. | 330/149 |
| 5,675,286 | * 10/1997 | Baker et al. | 330/129 |
| 5,675,287 | * 10/1997 | Baker et al. | 330/129 |

FOREIGN PATENT DOCUMENTS 0 658 975  6/1995  (EP) .

* cited by examiner

*Primary Examiner*—Daniel Hunter
*Assistant Examiner*—Thuan T. Nguyen
(74) *Attorney, Agent, or Firm*—Coats & Bennett

(57) ABSTRACT

An RF amplifier for a transmitter develops a phase modulation command representing a desired phase modulation of an RF signal, and an amplitude modulation command representing a desired amplitude modulation of the RF signal. An oscillator develops an RF input signal phase modulated based on the phase modulation command. A power amplifier receives the RF input signal and amplifies the RF input signal based on the amplitude modulation command to develop an RF output signal. A modulation control is operatively associated with the oscillator. The modulation control includes a phase memory for storing phase correction information correlating the amplitude modulation commands to a phase modulation error and a phase control for varying the phase modulation command based on the phase modulation error to correct for unintended phase errors created by amplitude modulation of the power amplifier.

26 Claims, 7 Drawing Sheets

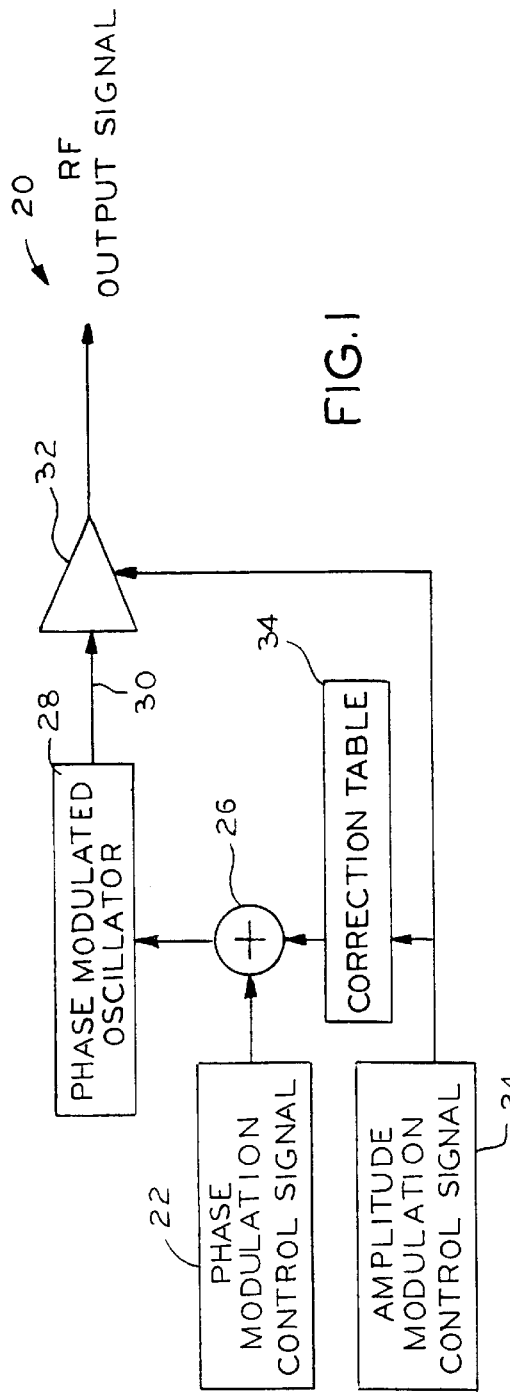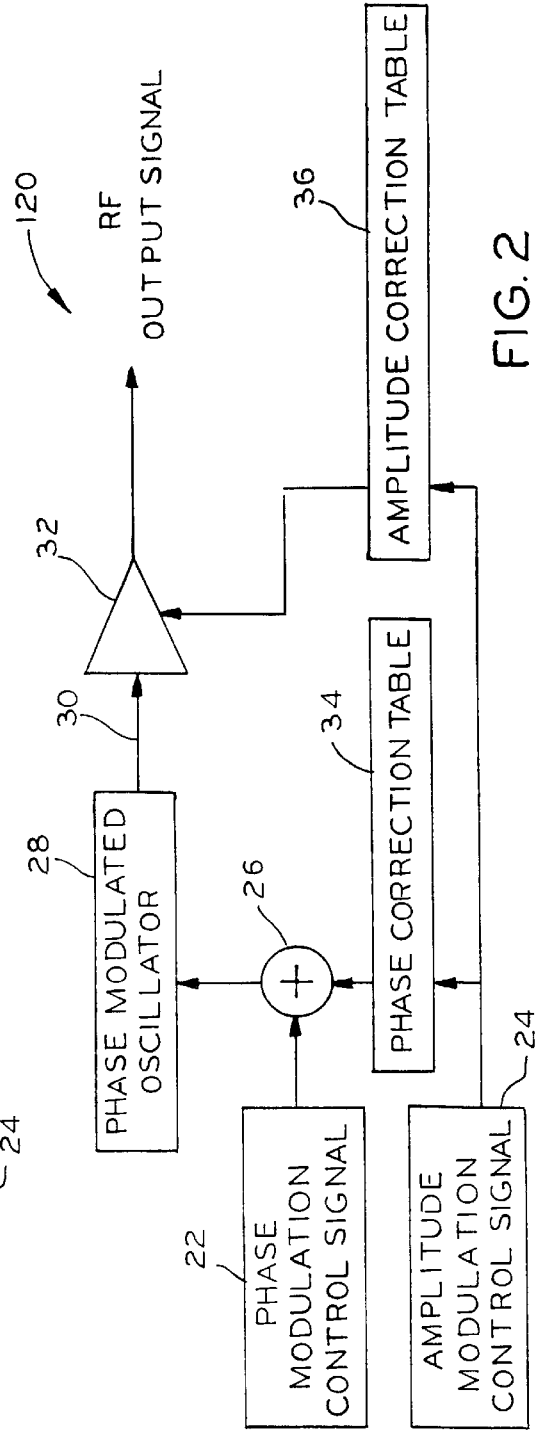

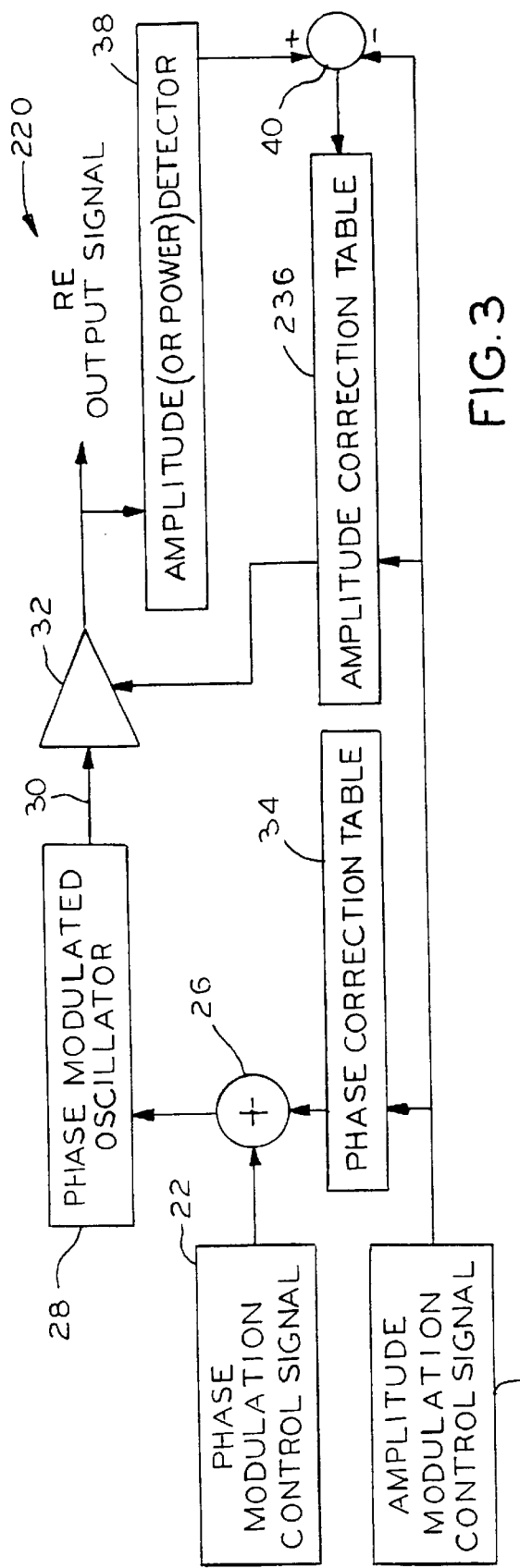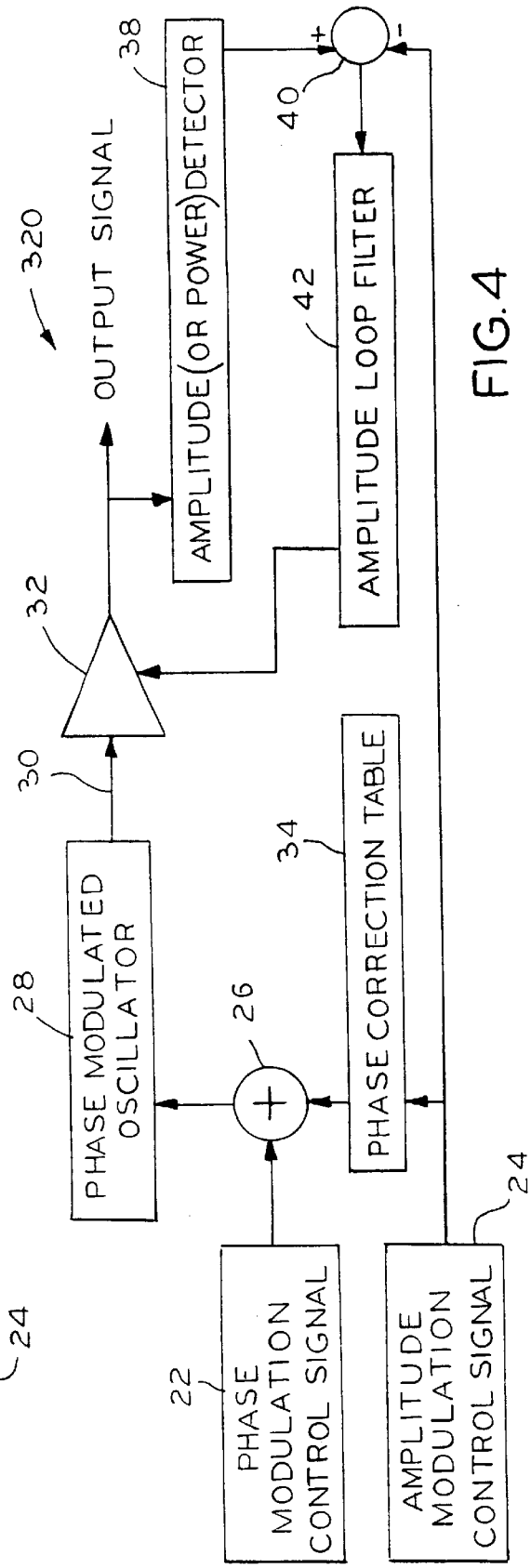

AMPLITUDE MODULATION TO PHASE MODULATION CANCELLATION METHOD IN AN RF AMPLIFIER

FIELD OF THE INVENTION

This invention relates to RF amplifiers and, more particularly, to a circuit and method for cancelling the effects of unintended phase modulation that can occur when a power amplifier is amplitude modulated.

BACKGROUND OF THE INVENTION

Radio frequency (RF) transmitters, such as used in cellular telephones, develop an RF signal to be transmitted through the air. Information is carried in the signal via some form of modulation such as frequency modulation, phase modulation, amplitude modulation, or a combination of these.

It may be desirable to create a modulated signal with both amplitude and phase modulation. With the necessity of developing small and lightweight devices, particularly cellular telephones, it is important that such amplifier circuits use a minimum of components. One possibility is to use a combination of phase modulation of a master oscillator at a carrier frequency and amplitude modulation of a power amplifier. However, unintended phase modulation can occur when the power amplifier is amplitude modulated. This problem has been addressed by including the amplitude and modulated power amplifier within the total phase locked loop. This can cause the out of band signal that occurs if as a loop is locking to be broadcast unless a switch with very large isolation is included. The feedback point from the voltage-controlled oscillator can be shifted to the output of the power amplifier only after the loop has locked and is on frequency. This shift can cause disruptions of the loop and cause the loop to lose lock.

The present invention is directed to overcoming one or more of the problems discussed above in a novel and simple manner.

SUMMARY OF THE INVENTION

In accordance with the invention there is provided a circuit and method for correcting a phase modulation command based on an amplitude modulation command.

Broadly, there is disclosed herein an RF amplifier including command means developing a phase modulation command representing a desired phase modulation of an RF signal, and an amplitude modulation command representing a desired amplitude modulation of the RF signal. An oscillator develops an RF input signal phase modulated based on the phase modulation command. A power amplifier receives the RF input signal and amplifies the RF input signal based on the amplitude modulation command to develop an RF output signal. A modulation control is operatively associated with the oscillator. The modulation control includes phase memory means for storing phase correction information correlating the amplitude modulation commands to a phase modulation error and phase control means for varying the phase modulation command based on the phase modulation error to correct for unintended phase errors created by amplitude modulation of the power amplifier.

It is a feature of the invention that the phase control means comprises a summer that sums the phase modulation command and the phase modulation error and the sum is an input to the oscillator. It is another feature of the invention that the modulation control comprises a programmed processor.

It is a further feature of the invention that the phase memory means stores a mathematical function correlating the amplitude modulation command to the phase modulation error.

It is still a further feature of the invention that the phase memory means stores a list of amplitude modulation command values to phase modulation error values.

It is still another feature of the invention to provide means for determining actual phase modulation of the RF output signal and wherein the modulation control periodically updates the phase correction information using the monitored RF output signal phase modulation and the desired phase modulation.

It is still another feature of the invention to provide means for determining actual phase modulation of the RF output signal and wherein the modulation control compares the actual phase modulation to the phase modulation error to vary the phase modulation command. The control means comprises a summer that sums the phase modulation command with an output of the comparison of the actual phase modulation to the phase modulation error.

It is still a further feature of the invention to provide amplitude memory means for storing amplitude correction information correlating actual amplitude of the RF output signal relative to the desired amplitude modulation and amplitude control means for varying power amplifier supply voltage based on the amplitude modulation command modified responsive to the amplitude correction information. The modulation control determines phase modulation error based on the amplitude modulation command modified responsive to the correction information. Means are also provided for monitoring amplitude of the RF output signal. The amplitude control means periodically updates the amplitude correction information using the monitor RF output signal and the desired amplitude modulation. The amplitude control means varies power amplifier supply voltage based on a difference between monitored amplitude and the amplitude modulation command. The oscillator comprises a phase modulated voltage-controlled oscillator.

In accordance with another aspect of the invention, there is disclosed a method of developing an RF signal with both phase and amplitude modulation. The method comprises the steps of developing a phase modulation command representing a desired phase modulation of an RF signal, developing an amplitude modulation command representing a desired modulation of the RF signal, shifting the phase of the RF signal to provide an RF input signal phase modulated based on the phase modulation command, amplifying the RF input signal based on the amplitude modulation to develop an RF output signal, storing phase correction information correlating the amplitude modulation command to a phase modulation error, and varying the phase modulation command based on the phase modulation error to correct for unintended phase errors created by amplitude modulation of the RF input signal.

Further features and advantages of the invention will be readily apparent from the specification and from the drawings.

BRIEF DESCRIPTION OF THE DRAWING

FIG. 1 is a block diagram illustrating an amplifier circuit according to a first embodiment of the invention;

FIG. 2 is a block diagram illustrating an amplifier circuit according to a second embodiment of the invention;

FIG. 3 is a block diagram illustrating an amplifier circuit according to a third embodiment of the invention;

FIG. 4 is a block diagram illustrating an amplifier circuit according to a fourth embodiment of the invention;

DETAILED DESCRIPTION OF THE INVENTION

Figure 5:
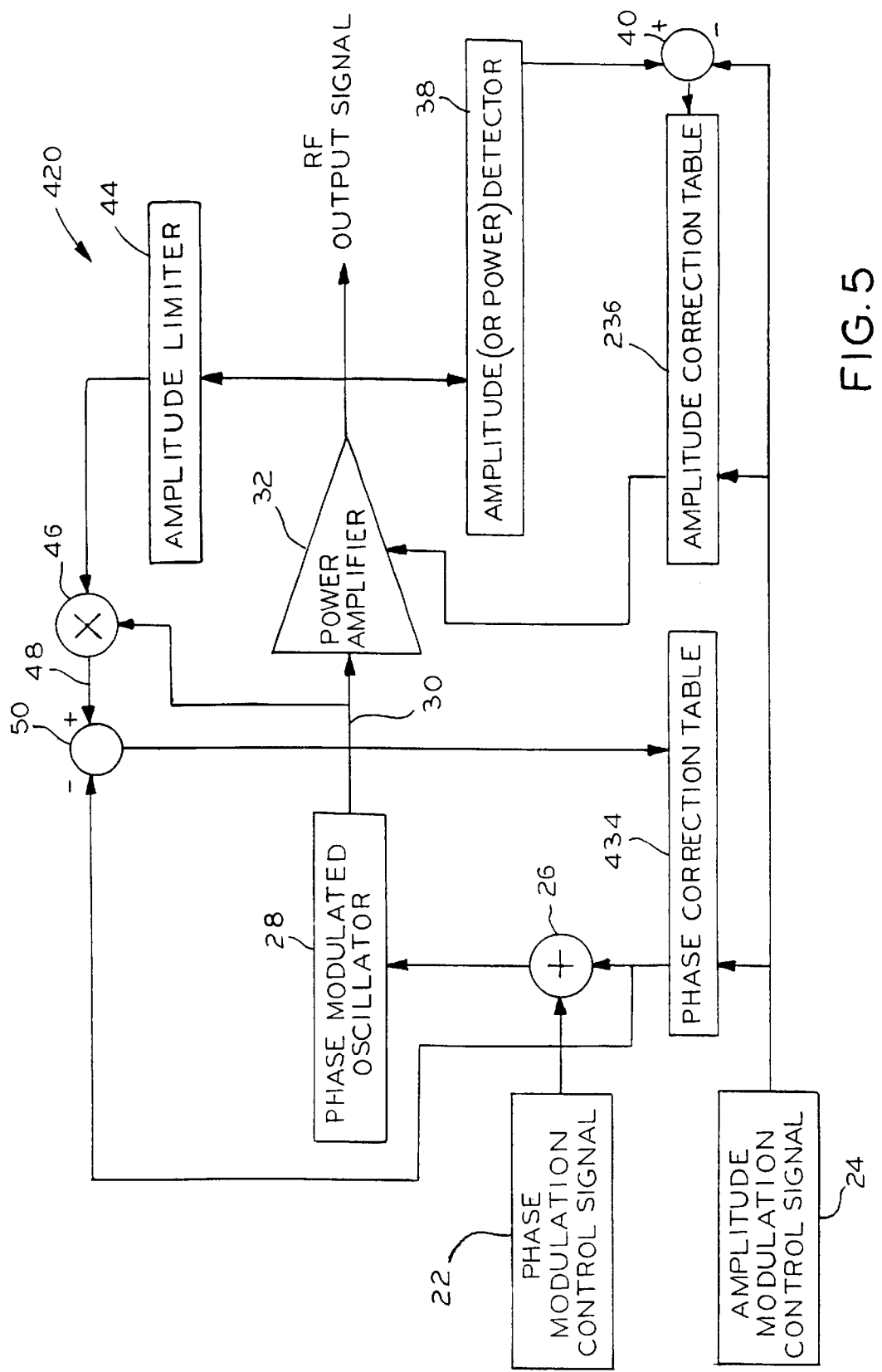
FIG. 5 is a block diagram illustrating an amplifier circuit according to a fifth embodiment of the invention.

Referring initially to FIG. 1, a transmitter RF amplifier circuit 20 according to a first embodiment of the invention is illustrated. The amplifier circuit 20 may be used in a transmitter that transmits an RF signal through the air such as in a mobile cellular telephone or the like. More generally, the transmitter may be used in any device which creates a modulated signal with both amplitude and phase modulation. The invention is particularly directed to a circuit and method to correct unintended phase error created by amplitude modulation of the power amplifier with a correction to the phase modulation control signal based on an amplitude modulation control signal.

In the illustrated embodiment of the invention, the amplifier circuit 20 uses a digital signal processor (DSP) and related circuitry for developing the output signals to be transmitted. As will be apparent, the circuit functions could be implemented in an ASIC, a programmed DSP, or a programmed microprocessor, or other similar type device.

The RF amplifier circuit 20 includes a block 22 that develops a phase modulation command or control signal representing a desired phase modulation of an RF signal. A block 24 develops an amplitude modulation command or control signal representing a desired amplitude modulation of the RF signal. The phase modulation control signal 22 is applied through a summer 26 to a phase modulated oscillator 28. The oscillator 28 can be any form of phase modulated source. One example is a voltage-controlled oscillator (VCO) in a phase-locked loop (PILL), whereby either the reference signal is phase modulated with a complex vector (I/Q) modulator, or the phase modulation is impressed within the loop. The phase modulation is now part of an RF input signal on a line 30 and is amplified by a power amplifier 32. The output of the power amplifier 32 comprises an RF output signal. The power amplifier 30 is controlled by the amplitude modulation control signal from the block 24.

In accordance with the invention, the amplitude modulation control signal 24 is input to a phase correction table 34. The output of the correction table 34 is supplied to the summer 26. The correction table 34 is stored in a suitable memory of the amplifier circuit associated with the DSP. The correction table 34 correlates the amplitude modulation control signal to a phase modulation error. Particularly, the correction table 34 may be either a list of phase values versus the amplitude control signal, or a mathematical function linking these two variables. The function or table is different for each type of power amplifier technology or general design, but is constant across different units in a manufacturing run made from one technology and design. The summer 26 sums the phase modulation control signal with the phase modulation error to correct for unintended phase errors created by amplitude modulation of the power amplifier 32.

FIG. 1 illustrates a basic implementation of the invention. More complex variants of the invention include a similar correction table relating the amplitude control signal 24 to a corrected signal to be sent to the power amplifier 32. These more complex variants are illustrated in FIGS. 2–4.

Referring to FIG. 2, a transmitter amplifier circuit 120 according to a second embodiment of the invention is illustrated. Many of the elements of the amplifier circuit 120 correspond directly to related elements in the amplifier circuit 20 of FIG. 1. For simplicity, these elements utilize like reference numerals. Where the elements are generally similar, they are referenced with reference numerals 100 higher.

The amplifier circuit 120 uses open loop amplitude correction. The amplitude modulation control signal 24 is applied to an amplitude correction table 36. The amplitude correction table 36 is stored in a suitable memory associated with the DSP. The memory stores an inverse of a transfer curve of the power amplifier RF signal amplitude output versus the control signal 24. Particularly, the amplitude correction table 36 modifies the value of the desired amplitude to an amplitude that, when applied to the system results in the correct amplitude of the RF signal out. The modified control signal from the correction table 36 is applied to the power amplifier 32, as discussed more particularly below.

Referring to FIG. 3, a transmitter amplifier circuit 220 according to a third embodiment of the invention is illustrated. Many of the elements of the amplifier circuit 220 correspond directly to related elements in the amplifier circuit 20 of FIG. 1. For simplicity, these elements utilize like reference numerals. Where the elements are generally similar, they are referenced with reference numerals 200 higher.

The amplifier circuits 220 utilizes closed loop amplitude correction with sampled error measurement. This embodiment presumes that there will be some variation of necessary correction over temperature or time or just from unit to unit. These variations are corrected for.

The amplitude or power level at the output of the power amplifier 32 is measured with an amplitude or power detector 38. The detector 38 measures the output signal at a rate much lower than the modulation symbol rate. The detected amplitude is compared to the amplitude modulation control signal in a summer 40. The output of the summer 40 is applied to an amplitude correction table 236 to correct the table in non-real time. The amplitude correction table 236 is similar to the amplitude correction table 36.

Referring to FIG. 4, a transmitter amplifier circuit 320 according to a fourth embodiment of the invention is illustrated. Many of the elements of the amplifier circuit 320 correspond directly to related elements in the amplifier circuit 20 of FIG. 1. For simplicity, these elements utilize like reference numerals. Where the elements are generally similar, they are referenced with reference numerals 300 higher.

The amplifier circuit 320 uses closed loop amplitude correction with real time error measurement. Particularly, the amplitude correction occurs in real time. Instead of an amplitude correction table, the amplitude modulation control signal 24 and the amplitude detector 38 are both connected to the summer 40, which supplies its output to an amplitude loop filter 42. The amplitude loop filter 42 is in turn connected to the power amplifier 32. As a result, the desired amplitude control signal versus the measured amplitude is fed to the power amplifier control port to obtain the desired output amplitude. This implementation is more limiting in that the loop filter 42 and loop gain must be constrained to make the loop stable.

The amplitude modulation methods of FIGS. 1–4 can also be combined with similar variants on the phase modulation path. These variations are illustrated in FIGS. 5 and 6.

Figure 6:
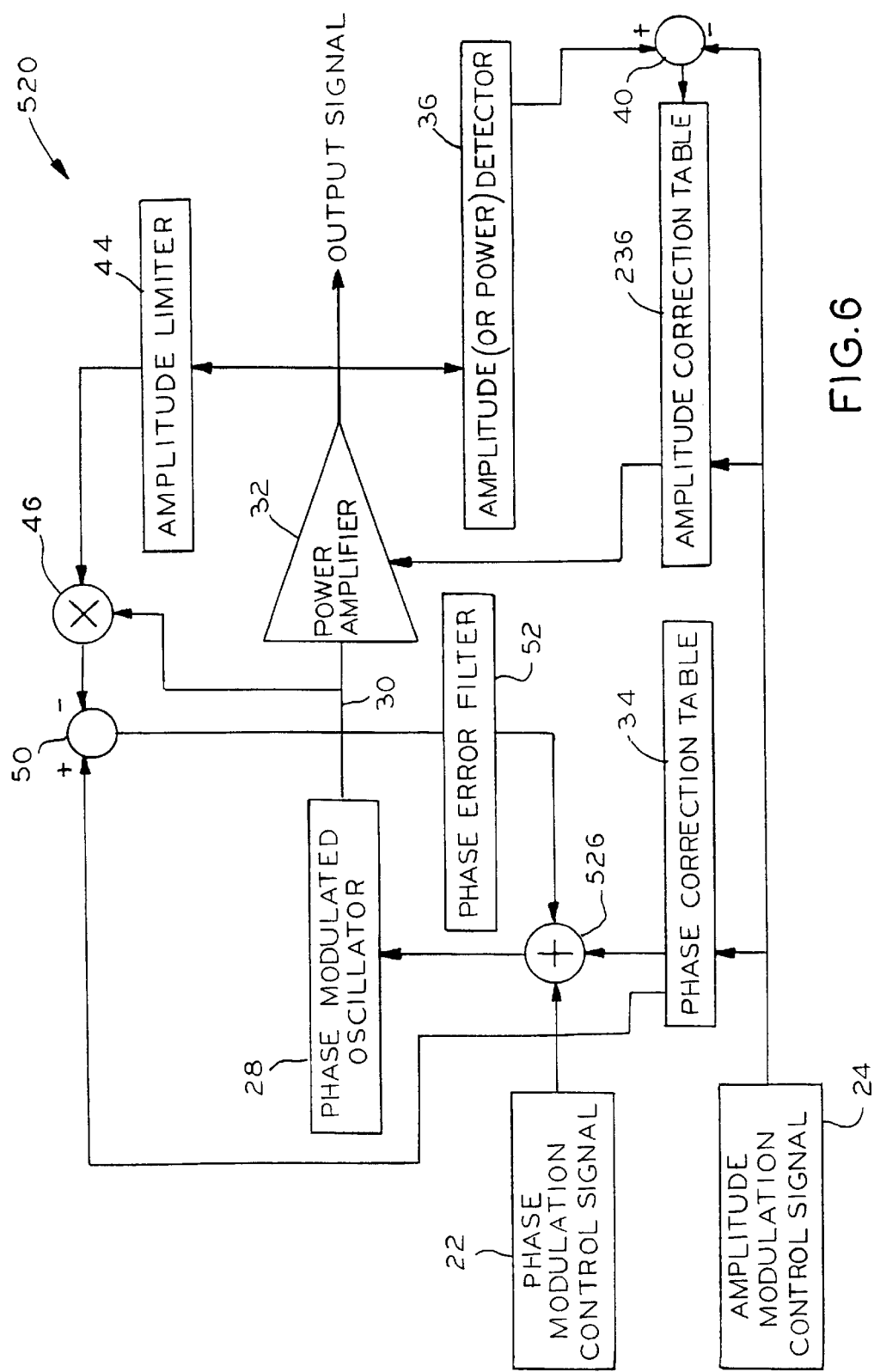
FIG. 6 is a block diagram illustrating an amplifier circuit according to a sixth embodiment of the invention.

Referring to FIG. 5, a transmitter amplifier circuit 420 according to a fifth embodiment of the invention is illustrated. Many of the elements of the amplifier circuit 420 correspond directly to related elements in the amplifier circuits of FIGS. 1–4. For simplicity, these elements utilize like reference numerals. Where the elements are generally similar, they are referenced with reference numerals 400 higher.

The amplifier circuit 420 uses closed loop phase correction with sampled error measurement combined with closed loop amplitude correction with sampled error measurement. Particularly, the closed loop amplitude correction is similar to that shown above relative to FIG. 3. An amplitude limiter 44 is connected to the output of the power amplifier 32. The amplitude limiter 44 has little or no amplitude to phase conversion. The amplitude limiter 44 removes the amplitude modulation imposed by the power amplifier 32. The output of the amplitude limiter 44 is compared to the RF input signal on the line 30 in a mixer 46 to produce a measured phase difference or error on a line 48. This measured phase error is that produced during amplitude modulation by the power amplifier 32. This measured phase error is then compared with the output of the phase correction table 434, which represents an expected unintended phase error, in a summer 50. The difference between these two signals is used to update the phase correction table 434, or mathematical function. Because the phase correction table or function will only change with slowly varying conditions, such as temperature, the error sampling can occur at rates much slower than the modulation rates.

The phase correction table 34 characteristically has little or no correction for amplitudes below some value about 10–15 db below the compression amplitude of the power amplifier 32. Therefore, the amplitude limiter 44 and phase comparator 50 do not have to operate over a very wide dynamic range.

Referring to FIG. 6, a transmitter amplifier circuit 520 according to a sixth embodiment of the invention is illustrated. Many of the elements of the amplifier circuit 520 correspond directly to related elements in the amplifier circuits of FIGS. 1–4. For simplicity, these elements utilize like reference numerals. Where the elements are generally similar, they are referenced with reference numerals 500 higher.

The amplifier circuit 520 uses closed loop phase correction with real time error measurement combined with closed loop amplitude correction with sampled error measurement. Again, the amplitude correction is similar to that discussed above relative to FIG. 3.

In this embodiment, the difference between the measured phase error from the mixer 48 and the expected phase correction from the table 34, calculated in the summer 50, is filtered in a phase error filter 52. The output of the phase error filter 52 is input to a summer 526 which also receives the phase modulation control signal 22 and the output of the phase correction table 34. This uses a feedback combination of the phase correction signal plus the phase error. The phase error filter 52 is constrained in its parameters in order to make the loop stable. Because the correction is made in real time, it is faster than the symbol rate.

Figure 7:
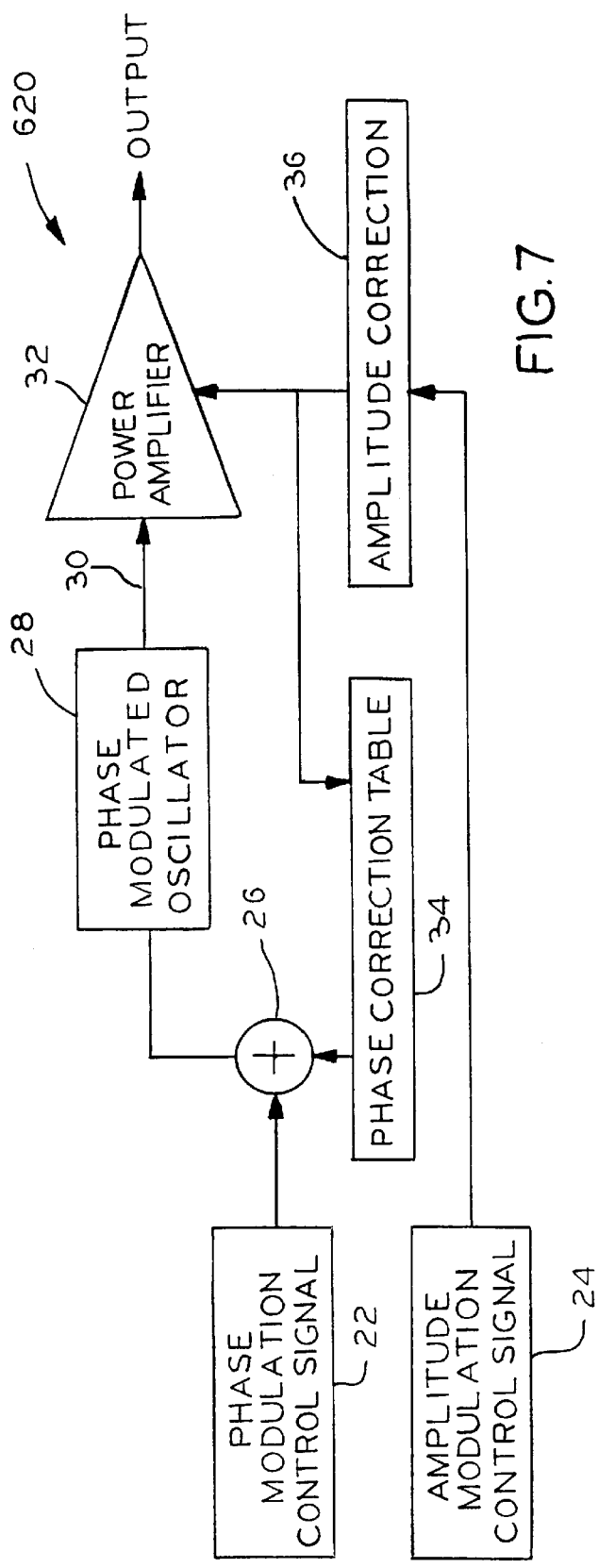
FIG. 7 is a block diagram illustrating an amplifier circuit according to a seventh embodiment of the invention.

Referring to FIG. 7, a transmitter amplifier circuit 620 according to a seventh embodiment of the invention is illustrated. Many of the elements of the amplifier circuit 620 correspond directly to related elements in the amplifier circuit 20 of FIG. 1. For simplicity, these elements utilize like reference numerals.

The amplifier circuit 620 illustrates a variation that could overlay any of the circuits of FIGS. 1–6. In this variation the phase correction table 34 does not receive the amplitude modulation control signal. Instead, the output of the amplitude modulation correction table 36 is input to the phase correction table 34. This variation is advantageous, as the transmission phase varies from a constant when the power amplifier behaves non-linearly. This characteristic is more associated with the actual amplitude control signal to the power amplifier 32 than the command signal 24 typically supplied from a waveform generator.

In the illustrated embodiments of the invention, the methods for generating the phase modulation control signal 22 and the amplitude modulation control signal 24 can be any number of standard methods. They can be implemented in hardware or software, such as in the DSP, or in a combination of the two.

In an exemplary embodiment of the invention, I and Q modulation signals that would normally be used as inputs to a standard vector modulator are assumed to have been created. The two signals are input to a device that can take the four quadrant arc tangent of the I and Q signals. This then becomes the phase modulation control signal once it is scaled appropriately for the control of the phase modulated oscillator 28. The same I and Q signals are input to a modulus function which results in the amplitude control signal once it is also scaled appropriately for the amplitude modulator. If the phase modulated oscillator 28 is actually a frequency modulated phase lock loop, then the phase modulation control signal 22 will have to be mathematically differentiated to control the oscillator.

Figure 8:
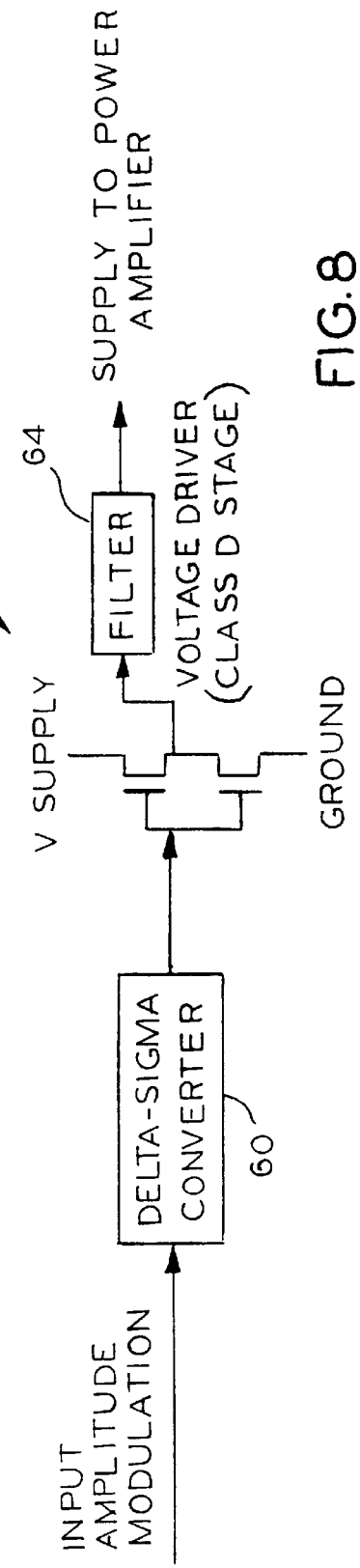
FIG. 8 is a block diagram of a circuit for controlling supply voltage to the power amplifier for any of the circuits of FIGS. 1–7.

An efficient method for amplitude modulating the power amplifier 32 is shown in FIG. 8. The amplitude modulation control signal is applied to a modulator 60, such as a Δ-Σ converter, that creates a sequence of one bit digital signal whose average mimics the input waveform. A Class D amplifier stage 62 boosts the current capacity of the modulated signal so that its output is either the full battery voltage or zero, depending on the binary state of the signal input to the converter 60. The amplified signal is applied through a low pass filter 64, with the smooth voltage being connected to the drain or collector of the power amplifier 32. Thus, when empowered by the power amplifier 32 on the RF signal from the phase-modulated source, the final output signal is the original waveform created by a waveform generator but now on an RF carrier signal at the appropriate frequency.

Figure 9:
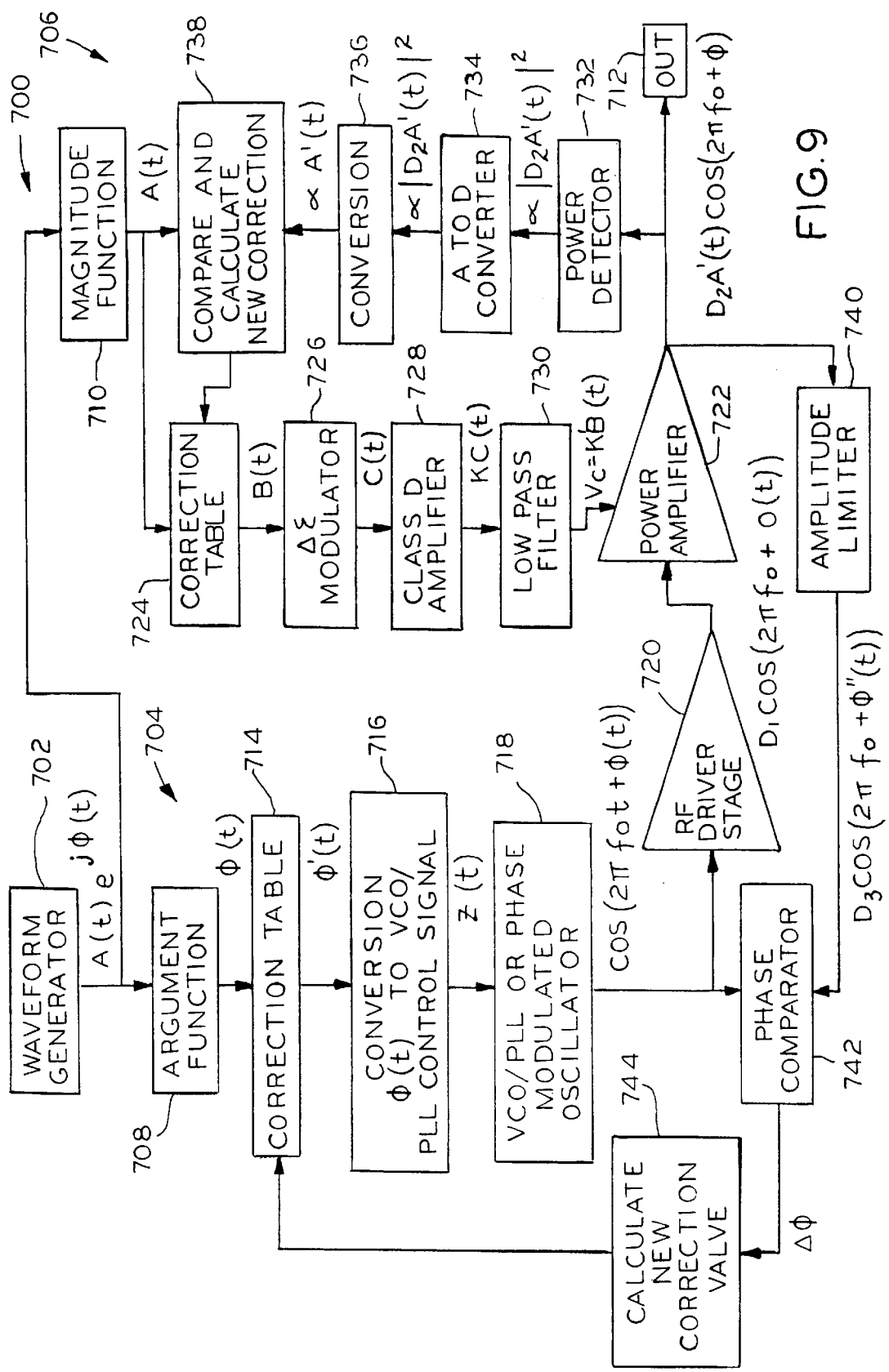
FIG. 9 is a detailed block diagram illustrating an implementation of the amplifier circuit of FIG. 5.

Referring to FIG. 9, a transmitter amplifier circuit 700 is illustrated. Particularly, the amplifier circuit 700 comprises a more detailed implementation of the amplifier circuit 420 of FIG. 5.

The amplifier circuit 700 includes a waveform generator 702. The waveform generator 702 creates the total modulation, including amplitude and phase, appropriate to the digital data being transmitted and the modulation characteristics. The waveform is delivered to a phase modulation path 704 and an amplitude modulation path 706. The phase modulation path 704 includes an argument function 708 to create a phase modulation control signal φ(t). This corresponds to the phase modulation control signal 22 discussed above. The amplitude modulation path includes a magnitude function 710 to create an amplitude modulation control signal A(t) representing a desired amplitude of the RF output signal. This corresponds to the amplitude modulation control signal 24 discussed above. Both signals must be time synchronized such that the net effect through the amplifier circuit 700 is to create the desired composite signal at the output represented by a block 712.

In the phase modulation path 704, the phase modulation control signal is applied to a phase correction table 714. The phase correction table 714 corresponds to the phase correction table 434 discussed above relative to FIG. 5. The output of the phase correction table 714 is applied to a conversion block 716. The conversion block 716 converts the corrected phase modulation signal to an appropriate format and level necessary for a phase modulated oscillator 718. The oscillator 718 can be any form of phase modulated source. One example is a VCO/PLL, whereby either the reference signal is phase modulated with a complex vector (I/Q) modulator or the phase modulation is impressed within the loop. The phase modulation is now part of an RF signal at frequency $f_0$ and is amplified by an RF driver stage 720. The RF driver stage 720 supplies sufficient signal level to a power amplifier 722 so that it is overdriven and at the output of the power amplifier 722, representing the output 712, only responds to the level of its supply voltage.

In the amplitude modulation path 706, the control signal from the magnitude function 710 is applied to a correction table 724. The correction table 724 corresponds to the amplitude correction table 236 discussed above relative to FIG. 5. Particularly, a suitable DSP memory stores an inverse of the transfer curve of the power amplifier RF signal amplitude output versus the control signal. The correction table 724 modifies the value of the desired amplitude to an amplitude that, when applied to the system, results in the correct amplitude of the RF signal out. The modified control signal is applied to a modulator 726 that creates a sequence of one bit digital signals whose average mimics the input waveform. Any pulse density modulator could be used. However, a Δ-Σ modulator has the advantage that its noise versus frequency is low at low frequencies and high at high frequencies. A Class D amplifier stage 728 boosts the current capacity of the modulated signal as its output is either the full battery voltage or zero, depending on the binary state of the signal input to the modulator 726. The amplified signal is applied through a low pass filter 730, with the smooth voltage being connected to the drain or collector of the power amplifier 722. Thus, when empowered by the power amplifier 32 on the RF signal from the phase-modulation path 704, the final output signal is the original waveform created by the waveform generator 702 but now on an RF carrier signal at frequency $f_0$.

To maintain a faithful reproduction of the signal from the waveform generator 702 to the output 712, it is necessary to continually correct for non-linearities in the amplitude modulation process. The power level at the output of the power amplifier 722 is measured with a power detector 732. The power signal is sampled at an analog to digital converter 734. A conversion block 736 converts the power level to amplitude by taking the square root and scaling it to the appropriate level with a constant so that it can be compared with the desired amplitude at a block 738. Particularly, the block 738 compares the desired amplitude from the block 710 and the measured amplitude from the block 736 and a new correction value is calculated for the particular level of the desired amplitude. The new value is inserted in the correction table at the block 724 if it is sufficiently different from the prior stored value for that specific value of the control signal A(t).

The correction table at the block 724 is maintained over varying conditions of temperature, power amplifier loading, battery voltage, etc. The maintenance of the correction table in the block 724 is easily done at a very low sampling rate.

To provide the closed loop phase correction, an amplitude limiter 740 is also connected to the output of the power amplifier 722. The amplitude limiter 740, with little or no amplitude to phase conversion, removes the amplitude modulation imposed by the power amplifier 722. A phase comparator 742 compares the actual phase modulation to the desired phase modulation from the oscillator 718 to compute a Δ phase applied to a block 744 that calculates a new correction value to be inserted in the correction table at the block 714 if it is sufficiently different from the prior stored value for that specific value of the phase modulation control signal.

Figure 10:
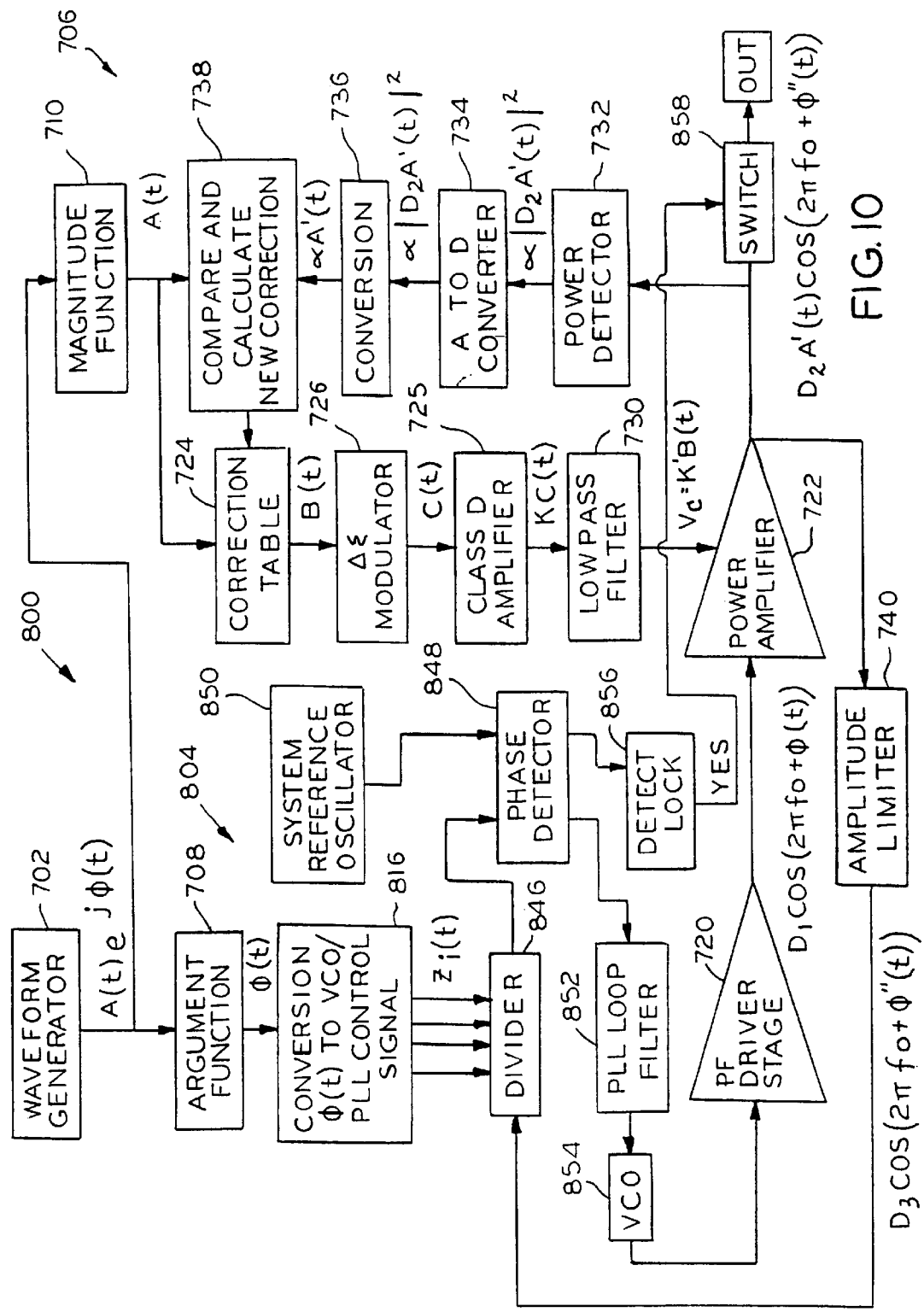
FIG. 10 is a detailed block diagram of an amplifier circuit according to a further embodiment of the invention.

Referring to FIG. 10, a transmitter amplifier circuit 800 according to a further embodiment of the invention is illustrated. The amplifier circuit 800 uses many components that are virtually identical to those discussed above relative to the amplifier circuit 700 of FIG. 9. For simplicity, those elements are identified with like reference numerals. Where the elements are generally similar, they are referenced with corresponding reference numerals in the 800 series.

In the embodiment of FIG. 10, the amplitude modulation path 706 is identical. A modified phase modulation path 804 is illustrated. The desired phase modulation signal from the argument function block 708 is input to a conversion block 816 which converts the phase modulation control signal into a set of binary control signals $Z_i(t)$ to control the divisor number of a frequency divider 846. The input to the divider 846 is the measured phase from the amplitude limiter 740. The output of the divider 846 is supplied to a phase detector 848. The phase detector 848 is also connected to a system reference oscillator 850. The output of the phase detector 848 is supplied to the PLL loop filter 852, which is in turn supplied to a VCO 854. The output of the VCO 854 is supplied to the RF driver stage 720. The output of the phase detector 848 is also supplied to a detect lock 856 which controls a switch 858 connected to the output of the power amplifier 722.

The amplifier circuit 800 of FIG. 10 utilizes the post power amplifier phase as the input to the divider 846, rather than the output of the VCO 854. This uses a larger loop to eradicate phase modulation introduced by the power amplifier 722. However, when the circuit is out of lock, then it is also out of band. The switch 858 prevents broadcast of the signal during lockup. The amplifier circuit 800 is particularly practical in lower power applications.

As is apparent, the amplifier circuit 20 of FIG. 1 illustrates a basic transmitter design with correction for unintended phase error created by amplitude modulation of a power amplifier with a correction to the phase modulation control signal based on the amplitude modulation control signal. FIGS. 2–7, 9 and 10 illustrate alternative transmitter amplifier circuit designs using the same basic method with further variations.

As will be appreciated by one of ordinary skill in the art, the present invention may be embodied as methods or devices. Accordingly, the present invention may take the form of an entirely hardware embodiment, an entirely software embodiment, or an embodiment combining hardware and software aspects.

The present invention has been described with respect to the block diagram illustrations. It will be understood that many of the blocks can be implemented by computer program instructions. These program instructions, which represent steps, may be provided to a processor to produce a machine.

Accordingly, blocks of the illustration support combinations of means for performing the specified functions and combinations of steps for performing the specified functions. It will be understood that each block of the illustrations, and combinations of blocks in the illustrations, can be implemented by special purpose hardware-based systems which perform the specified functions or steps, or combinations of special purpose hardware and computer instructions.

Thus, in accordance with the invention there is provided an RF amplifier circuit in which unintended phase error created by the amplitude modulation of the power amplifier is corrected with a correction to the phase modulation control signal based on the amplitude modulation control signal.

We claim:

1. An RF amplifier comprising:
   command means developing a phase modulation command representing a desired phase modulation of an RF signal and an amplitude modulation command representing a desired amplitude modulation of the RF signal;
   an oscillator developing an RF input signal phase modulated based on the phase modulation command;
   a power amplifier receiving the RF input signal and amplifying the RF input signal based on the amplitude modulation command to develop an RF output signal;
   a modulation control operatively associated with the oscillator, the modulation control including phase memory means for storing phase correction information correlating the amplitude modulation command to a phase modulation error and phase control means for varying the phase modulation command based on the phase modulation error to correct for unintended phase errors created by amplitude modulation of the power amplifier.

2. The RF amplifier of claim 1 wherein the phase control means comprises a summer that sums the phase modulation command and the phase modulation error and the sum is an input to the oscillator.

3. The RF amplifier of claim 1 wherein the modulation control comprises a programmed processor.

4. The RF amplifier of claim 1 wherein the phase memory means stores a mathematical function correlating the amplitude modulation command to the phase modulation error.

5. The RF amplifier of claim 1 wherein the phase memory means stores a list of amplitude modulation command values to phase modulation error values.

6. The RF amplifier of claim 1 further comprising means for determining actual phase modulation of the RF output signal and wherein the modulation control periodically updates the phase correction information using the monitored RF output signal phase modulation and the desired phase modulation.

7. The RF amplifier of claim 1 further comprising means for determining actual phase modulation of the RF output signal and wherein the modulation control compares the actual phase modulation to the phase modulation error to vary the phase modulation command.

8. The RF amplifier of claim 7 wherein the control means comprises a summer that sums the phase modulation command with an output of the comparison of the actual phase modulation to the phase modulation error.

9. The RF amplifier of claim 1 further comprising amplitude memory means for storing amplitude correction information correlating actual amplitude of the RF output signal relative to the desired amplitude modulation and amplitude control means for varying power amplifier supply voltage based on the amplitude modulation command modified responsive to the amplitude correction information.

10. The RF amplifier of claim 9 wherein the modulation control determines phase modulation error based on the amplitude modulation command modified responsive to the amplitude correction information.

11. The RF amplifier of claim 9 further comprising means for monitoring amplitude of the RF output signal.

12. The RF amplifier of claim 11 wherein the second control means periodically updates the amplitude correction information using the monitored RF output signal and the desired amplitude modulation.

13. The RF amplifier of claim 11 wherein the amplitude control means varies power amplifier supply voltage based on a difference between monitored amplitude and the amplitude modulation command.

14. The RF amplifier of claim 9 wherein the oscillator comprises a phase modulated voltage-controlled oscillator.

15. The method of developing an RF signal with both phase and amplitude modulation comprising the steps of:
   developing a phase modulation command representing a desired phase modulation of an RF signal;
   developing an amplitude modulation command representing a desired amplitude modulation of the RF signal;
   shifting the phase of the RF signal to provide an RF input signal phase modulated based on the phase modulation command;
   amplifying the RF input signal based on the amplitude modulation to develop an RF output signal;
   storing phase correction information correlating the amplitude modulation command to a phase modulation error; and
   varying the phase modulation command based on the phase modulation error to correct for unintended phase errors created by amplitude modulation of the RF input signal.

16. The method of claim 15 wherein the varying step comprises the step of summing the phase modulation command and the phase modulation error and the sum is used to oscillate the RF signal.

17. The method of claim 15 wherein the storing step comprises storing a mathematical function correlating the amplitude modulation command to the phase modulation error.

18. The method of claim 15 wherein the storing step comprises storing a list of amplitude modulation command values to phase modulation error values.

19. The method of claim 15 further comprising the step of determining actual phase modulation of the RF output signal and periodically updating the phase correction information using the monitored RF output signal phase modulation and the desired phase modulation.

20. The method of claim 15 further comprising the step of determining actual phase modulation of the RF output signal and comparing the actual phase modulation to the phase modulation error to vary the phase modulation command.

21. The method of claim 20 wherein the varying step comprises summing the phase modulation command with an output of the comparison of the actual phase modulation to the phase modulation error.

22. The method of claim 15 further comprising the steps of storing amplitude correction information correlating actual amplitude of the RF output signal relative to the desired amplitude modulation and varying power amplifier supply voltage based on the amplitude modulation command modified responsive to the amplitude correction information.

23. The method of claim 22 wherein the phase modulation command is varied based on the amplitude modulation command modified responsive to the amplitude correction information.

24. The method of claim 22 further comprising the step of monitoring amplitude of the RF output signal.

25. The method of claim 24 further comprising the step of periodically updating the amplitude correction information using the monitored RF output signal and the desired amplitude modulation.

26. The method of claim 24 wherein the amplifier supply voltage is varied based on a difference between monitored amplitude and the amplitude modulation command.

\* \* \* \* \*